US007030664B2

(12) United States Patent
Choe

(10) Patent No.: US 7,030,664 B2
(45) Date of Patent: Apr. 18, 2006

(54) HALF-RAIL DIFFERENTIAL DRIVER CIRCUIT

(75) Inventor: Swee Yew Choe, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 155 days.

(21) Appl. No.: 10/611,443

(22) Filed: Jun. 30, 2003

(65) Prior Publication Data

US 2004/0264071 A1  Dec. 30, 2004

(51) Int. Cl.
H03K 3/00 (2006.01)
(52) U.S. Cl. .................. 327/108; 327/112; 326/26; 326/27
(58) Field of Classification Search ................ 327/108, 327/112, 379, 389, 391; 326/26, 27, 28, 326/82, 83, 85, 86
See application file for complete search history.

(56) References Cited

U.S. PATENT DOCUMENTS

| 4,247,791 | A | 1/1981 | Rovell | 307/238 |
|---|---|---|---|---|
| 5,859,548 | A | 1/1999 | Kong | 326/113 |
| 6,028,454 | A | 2/2000 | Elmasry et al. | 326/115 |
| 6,211,704 | B1 | 4/2001 | Kong | 326/121 |
| 6,229,745 | B1 * | 5/2001 | Nambu et al. | 365/207 |
| 6,373,763 | B1 * | 4/2002 | Taito et al. | 365/203 |
| 2001/0008497 | A1 * | 7/2001 | Horiguchi et al. | 365/226 |
| 2002/0000624 | A1 * | 1/2002 | Takemura et al. | 257/390 |
| 2004/0170050 | A1 * | 9/2004 | Itoh et al. | 365/149 |

OTHER PUBLICATIONS

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, Mar. 2, 2000 vol. 36 No. 5, pp. 404 to 405.

Kong et al., "Charge Recycling Differential Logic for Low-Power Application", ISSC96 secession 18, IEEE 0-780331962/98, 1998, pp. 302 to 448.

Choe et al., "Half Rail Differential Logic", ISSCC97/Secession 25/Processors and Logic/Paper SP 25.6 IEEE 0-7803-3721-2/97, 1997, pp. 420 to 421, 336 to 337 and 489.

Won et al., "Modified Half Rail Differential Logic for Reduced Internal Logic Swing", IEEE 0-7803-4455-3/98, 1998, pp. II-157 to II-160.

Kong et al., "Charge Recycling Differential Logic (CRDL) for Low-Power Application", IEEE Journal of Solid-State Circuits, vol. 31, No. 9, Sep. 1996, pp. 1267 to 1276.

* cited by examiner (Continued)

Primary Examiner—Tuan T. Lam
(74) Attorney, Agent, or Firm—Gunnison, McKay & Hodgson, L.L.P.; Philip J. McKay

(57) ABSTRACT

A half-rail differential driver circuit comprises a differential line pair, a high line and a low line, that are charged to half a first supply voltage, typically VDD, by shorting the high output line to the low output line during the pre-charge phase. The half-rail data lines are then pulled up or down during the evaluation phase. Since, according to the present invention, the switching differentials are only half-rail, the coupling capacitance is reduced by half. In addition, since according to the invention, the half-rail differential driver circuit employs a differential line pair, the return path is confined within the differential line pair, virtually eliminating the loop area and therefore virtually eliminating inductive coupling.

3 Claims, 2 Drawing Sheets

HALF-RAIL DIFFERENTIAL DRIVER CIRCUIT

FIELD OF THE INVENTION

The present invention relates generally to logic circuits and, more particularly, to half-rail driver or repeater circuits.

BACKGROUND OF THE INVENTION

FIG. 1 shows prior art driver or "buffer" unit 100 that was made up of driver circuits 101A to 101N. Those of skill in the art will readily recognize that while only four driver circuits 101A, 101B, 101N–1, and 101N are shown in FIG. 1, a prior art driver system, such as prior art driver system 100, typically included numerous driver circuits such as driver circuits 101A, 101B, 101N–1, and 101N.

As shown in FIG. 1, each driver circuit typically included two inverters 103A and 103B, 105A and 105B, 106A and 106B, and 107A and 107B. Prior art driver circuits 101A, 101B, 101N–1, and 101N were typically used to drive relatively long wires and large loads. Typically, Prior art driver circuits 101A, 101B, 101N–1, and 101N were used to drive signals on large signal buses.

Prior art driver circuits 101A, 101B, 101N–1, and 101N were effective and adequate in prior art systems with slower clock speeds, however, as clock speeds have steadily increased into the multiple gigahertz ranges several drawbacks to prior art driver circuits 101A, 101B, 101N–1, and 101N have come to the forefront. For instance, one problem with prior art driver circuits 101A, 101B, 101N–1, and 101N was that of capacitive coupling, also known as Miller coupling or Miller capacitive coupling, between adjacent prior art driver circuits 101A, 101B and 101N, such as prior art driver circuits 101A and 101B.

Capacitive coupling is represented in FIG. 1 by representative capacitor 109 between prior art driver circuits 101A and 101B. Of course, those of skill in the art will readily recognize that in an actual prior art driver unit 100 there would be capacitive coupling between each adjacent prior art driver circuits and therefore, there would typically be multiple representative capacitors such as representative capacitor 109. Capacitive coupling is problematic for two reasons. First, capacitive coupling creates signal delay and therefore slows down signal speed. Second, capacitive coupling draws power from the system as signals must be driven to overcome its effects. In addition, as discussed in more detail below, capacitive coupling becomes more and more of a problem as signal speeds increase. Consequently, it is highly desirable to minimize capacitive coupling and minimize the size of representative capacitor 109.

The problem with prior art driver circuits 101A, 101B, 101N–1, and 101N was that there was potential for very large capacitance to develop between adjacent prior art driver circuits such as prior art driver circuits 101A and 101B. This was because, when a signal 111 on prior art driver circuit 101A was a digital high, such as at time T1, it was also possible that the signal 113 on prior art driver circuit 101B could be digital low. Therefore, the voltage differential between a point on prior art driver circuit 101A and a point on prior art driver circuit 101B would be maximum. Since the coupling capacitance is a function of voltage, the coupling capacitance would be maximum, i.e., representative capacitor 109 would be a maximum size. As discussed above this is a highly undesirable situation.

In addition, prior art driver circuits 101A, 101B, 101N–1, and 101N suffered from inductive coupling as well. Like capacitive coupling, inductive coupling slows down signal speed and draws power from the system as signals must be driven to overcome its effects. Consequently, it is also highly desirable to minimize inductive coupling. However, in contrast to capacitive coupling discussed above, inductive coupling occurs when two adjacent driver circuits, such as driver circuits 101N–1 and 101N have signals 114 and 115, respectively, that are at a digital high at the same time T1. In this case, there is maximum inductive coupling. However, the situation is made worse by the fact that inductive coupling is a function of area, i.e., the larger the area between the outgoing signal path and a return path, the larger the inductance. Since, as noted above, while only four driver circuits 101A, 101B, 101N—1, and 101N are shown in FIG. 1, a prior art driver system, such as prior art driver system 100, typically included numerous driver circuits such as driver circuits 101A, 101B, 101N–1, and 101N. Therefore, the area between the outgoing signal path and a return path could be quite large. Consequently, the inductive coupling could also be quite large.

As discussed above, prior art driver systems, such as prior art driver system 100, using prior art driver circuits, such as prior art driver circuits 101A, 101B, 101N–1, and 101N had the potential for very significant capacitive and inductive coupling. As a result, systems employing prior art driver systems 100 and prior art driver circuits 101A, 101B, 101N–1, and 101N suffered from slower signal speed, increased power usage and the wires and buses had to be made unduly wide to try and minimize these effects and provide adequate signal speed in a worst case scenario. Therefore, slower processor times were incurred and more precious silicon area was used.

What is needed is a drive circuit that reduces the effects of capacitive coupling, minimizes or eliminates inductive coupling and thereby allows for increased signal speed to accommodate high clock speed systems.

SUMMARY OF THE INVENTION

According to the present invention, a half-rail differential driver circuit comprises a differential line pair, a high line and a low line, that are charged to half a first supply voltage, typically VDD, by shorting the high output line to the low output line during the pre-charge phase. The half-rail data lines are then pulled up or down during the evaluation phase. Since, according to the present invention, the switching differentials are only half-rail, the coupling capacitance is reduced by half.

In addition, since according to the invention, the half-rail differential driver circuit employs a differential line pair, the return path is confined within the differential line pair, virtually eliminating the loop area and therefore virtually eliminating inductive coupling. Consequently, using half-rail differential driver circuits of the invention capacitive coupling is reduced up to fifty percent and inductive coupling is minimized, and virtually eliminated, so that delay is reduced, signal speed is increased, less power is used, and bus lines and wires can be made of smaller width.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

Figure 1:
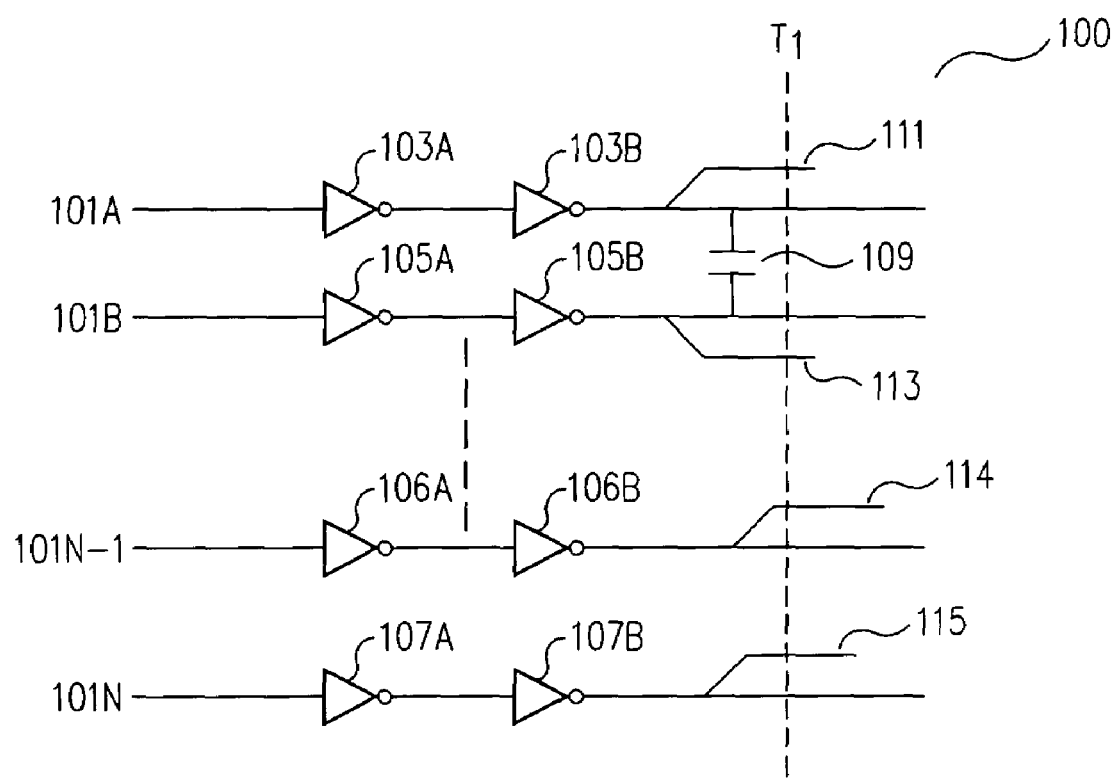
FIG. 1 shows prior art driver or "buffer" unit that was made up of multiple prior art driver circuits.

The invention will now be described in reference to the accompanying drawings. The same reference numbers may be used throughout the drawings and the following description to refer to the same or like parts.

According to the present invention, a half-rail differential driver circuit (200 in FIG. 2) comprises a differential line pair (291 and 293 in FIG. 2), a high line (291 or 293 in FIG. 2) and a low line (293 or 291 in FIG. 2), that are charged to half a first supply voltage (201 in FIG. 2), typically VDD, by shorting the high output line to the low output line during the pre-charge phase. The half-rail data lines are then pulled up or down during the evaluation phase.

Using the structure and method of the invention discussed above, the switching differentials are only half-rail. Consequently, the coupling capacitance is reduced by half compared to prior art structures and methods. In addition, since according to the invention, the half-rail differential driver circuit employs a differential line pair of half-rail differential driver circuit OUT terminal (291 in FIG. 2) and half-rail differential driver circuit OUTBAR terminal (293 in FIG. 2), the return path is confined within the differential line pair, virtually eliminating the loop area and therefore virtually eliminating inductive coupling. Consequently, using half-rail differential driver circuits of the invention capacitive coupling is reduced up to fifty percent and inductive coupling is minimized so that delay is reduced, signal speed is increased, less power is used, and bus lines and wires can be of minimal width.

Figure 2:
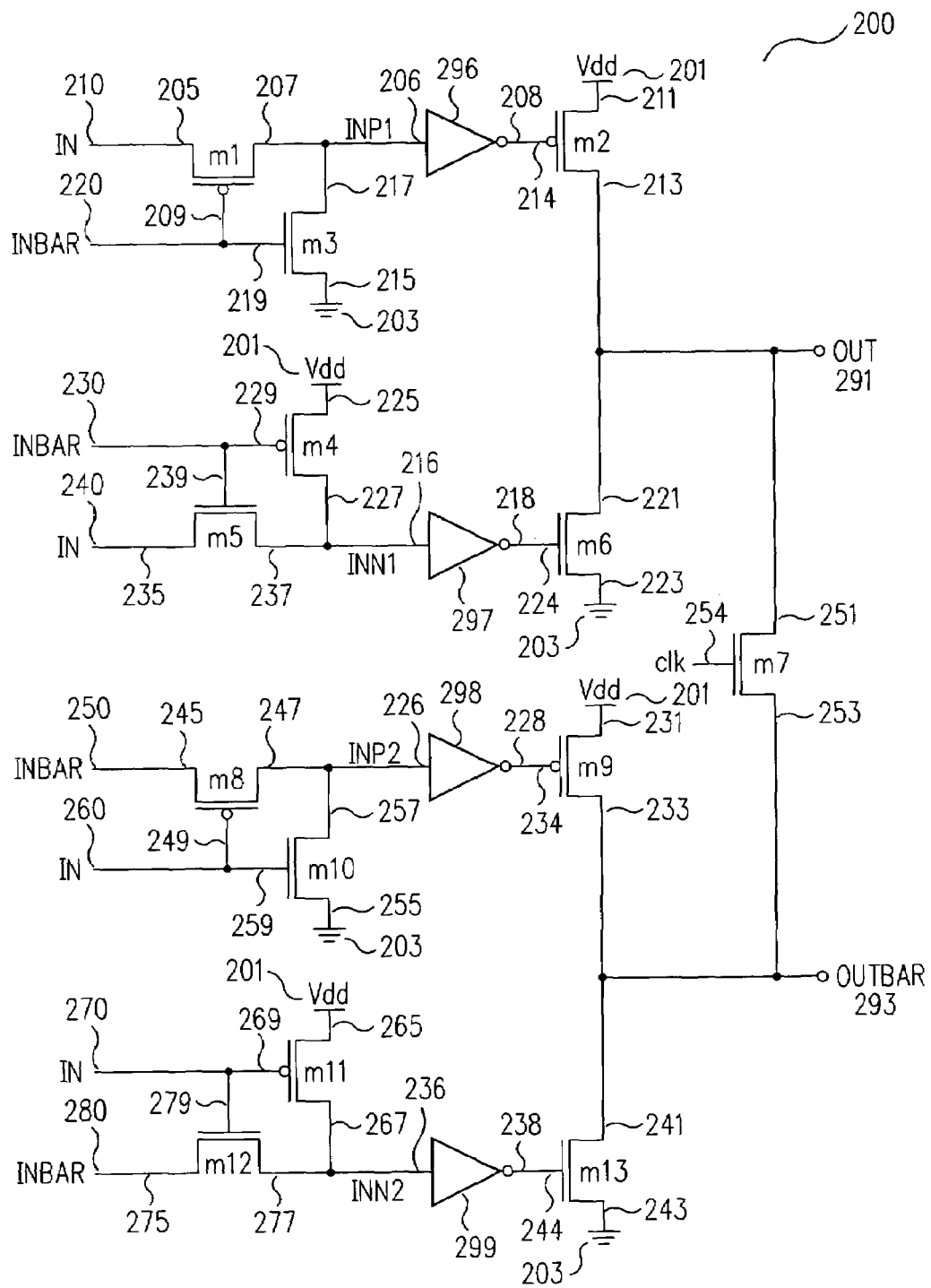
FIG. 2 shows a half-rail differential driver circuit in accordance with one embodiment of the invention.

FIG. 2 shows one embodiment of a half-rail differential driver circuit 200 in accordance with the invention. As shown in FIG. 2, half-rail differential driver circuit 200 includes: transistors of a first type, in one embodiment PFETS, m1, m2, m4, m8, m9, m11; transistors of a second type, in one embodiment NFETS, m3, m5, m6, m7, m10, and m13; and inverters 296, 297, 298 and 299.

As shown in FIG. 2, according to the present invention, a signal IN from a previous stage half-rail differential driver circuit (not shown), identical half-rail differential driver circuit 200, is coupled to: half-rail differential driver circuit first IN terminal 210; half-rail differential driver circuit second IN terminal 240; half-rail differential driver circuit third IN terminal 260 and half-rail differential driver circuit fourth IN terminal 270. Similarly, a signal INBAR from a previous stage half-rail differential driver circuit (not shown), identical half-rail differential driver circuit 200, is coupled to: half-rail differential driver circuit first INBAR terminal 220; half-rail differential driver circuit second INBAR terminal 230; half-rail differential driver circuit third INBAR terminal 250 and half-rail differential driver circuit fourth INBAR terminal 280.

According to one embodiment of the present invention: half-rail differential driver circuit first IN terminal 210 is coupled to a first flow electrode 205 of first transistor m1; half-rail differential driver circuit second IN terminal 240 is coupled to a first flow electrode 235 of fifth transistor m5; half-rail differential driver circuit third IN terminal 260 is coupled to a control electrode 249 of eighth transistor m8 and a control electrode 259 of tenth transistor m10; and half-rail differential driver circuit fourth IN terminal 270 is coupled to a control electrode 269 of eleventh transistor m11 and a control electrode 279 of twelfth transistor m12.

According to one embodiment of the present invention: half-rail differential driver circuit first INBAR terminal 220 is coupled to a control electrode 209 of first transistor m1 and a control electrode 219 of third transistor m3; half-rail differential driver circuit second INBAR terminal 230 is coupled to a control electrode 229 of fourth transistor m4 and a control electrode 239 of a fifth transistor m5; half-rail differential driver circuit third INBAR terminal 250 is coupled to a first flow electrode 245 of eighth transistor m8; and half-rail differential driver circuit fourth INBAR terminal 280 is coupled to a first flow electrode 275 of twelve transistor m12.

According to one embodiment of the invention, a second flow electrode 207 of first transistor m1 is coupled to a first node INP1, a second flow electrode 217 of third transistor m3 and an input terminal 206 of first inverter 296. According to one embodiment of the invention, first flow electrode 215 of third transistor m3 is coupled to a second supply voltage 203, in one embodiment ground.

According to one embodiment of the invention, a first flow electrode 225 of fourth transistor m4 is coupled to a first supply voltage 201, in one embodiment VDD, and a second flow electrode 227 of fourth transistor m4 is coupled to a second node INN1, a second flow electrode 237 of fifth transistor m5 and an input terminal 216 of second inverter 297. According to one embodiment of the invention, a second flow electrode 247 of eighth transistor m8 is coupled to a third node INP2, a second flow electrode 257 of tenth transistor m10 and an input terminal 226 of third inverter 298. According to one embodiment of the invention, a first flow electrode 255 of tenth transistor m10 is coupled to second supply voltage 203.

According to one embodiment of the invention, a first flow electrode 265 of eleventh transistor m11 is coupled to first supply voltage 201, and a second flow electrode 267 of eleventh transistor m11 is coupled to a fourth node INN2, a second flow electrode 277 of twelve transistor m12 and an input terminal 236 of fourth inverter 299.

According to one embodiment of the invention: output terminal 208 of first inverter 296 is coupled to a control electrode 214 of second transistor m2; output terminal 218 of second inverter 297 is coupled to a control electrode 224 of sixth transistor m6; output terminal 228 of third inverter 298 is coupled to a control electrode 234 of ninth transistor m9; and output terminal 238 of fourth inverter 299 is coupled to a control electrode 244 of thirtieth transistor m13.

According to one embodiment of the invention, a first flow electrode 211 of second transistor m2 is coupled to first supply voltage 201 and a second flow electrode 213 of second transistor m2 is coupled to a half-rail differential driver circuit OUT terminal 291, a second flow electrode 221 of sixth transistor m6, and a first flow electrode 251 of seventh transistor m7. According to one embodiment of the invention, a first flow electrode 223 of sixth transistor m6 is coupled to second supply voltage 203.

According to one embodiment of the invention, a first flow electrode 231 of ninth transistor m9 is coupled to first supply voltage 201 and a second flow electrode 233 of ninth transistor m9 is coupled to a half-rail differential driver circuit OUTBAR terminal 293, a second flow electrode 241 of thirtieth transistor m13 and a second flow electrode 253 of seventh transistor m7. According to one embodiment of the invention, a first flow electrode 243 of thirtieth transistor m13 is coupled to second supply voltage 203.

As shown in FIG. 2, and discussed above, seventh transistor m7 has its first flow electrode 251 coupled to half-rail differential driver circuit OUT terminal 291 and its second flow electrode 253 coupled to half-rail differential driver circuit OUTBAR terminal 293 so that seventh transistor m7 is coupled across differential line pair half-rail differential driver circuit OUT terminal 291 and half-rail differential driver circuit OUTBAR terminal 293. A control electrode 254 of seventh transistor m7 is coupled to the signal CLK. In addition, differential line pair half-rail differential driver circuit OUT terminal 291 and half-rail differential driver circuit OUTBAR terminal 293 are, in turn, coupled to the next stage half-rail differential driver circuit (not shown), identical half-rail differential driver circuit 200, to serve as signals IN and INBAR for that stage.

In operation, during the pre-charge phase: signal CLK is high; input signal IN on half-rail differential driver circuit first IN terminal 210; half-rail differential driver circuit second IN terminal 240; half-rail differential driver circuit third IN terminal 260; half-rail differential driver circuit fourth IN terminal 270; and signal INBAR on half-rail differential driver circuit first INBAR terminal 220; half-rail differential driver circuit second INBAR terminal 230; half-rail differential driver circuit third INBAR terminal 250 and half-rail differential driver circuit fourth INBAR terminal 280 are shorted together and the voltages are half of first supply voltage 201, in one embodiment VDD/2.

In this phase, differential line pair half-rail differential driver circuit OUT terminal 291 and half-rail differential driver circuit OUTBAR terminal 293 are also at half of first supply voltage 201, in one embodiment VDD/2, since signal CLK is high. Consequently, first node INP1 is pulled to second supply voltage 203, in one embodiment ground, and second node INN1 is pulled to first supply voltage 201, in one embodiment VDD, since transistors m1, m3, m4 and m5 are partially conducting. In this phase, transistors m2 and m6 are shut-off, thereby isolating half-rail differential driver circuit OUT terminal 291 from both first supply voltage 201 and second supply voltage 203. Similarly, third node INP2 is pulled to second supply voltage 203, in one embodiment ground, and fourth node INN2 is pulled to first supply voltage 201, in one embodiment VDD, since transistors m8, m10, m11 and m12 are partially conducting. In this phase, transistors m9 and m13 are shut-off, thereby also isolating half-rail differential driver circuit OUTBAR terminal 293 from both first supply voltage 201 and second supply voltage 203.

In the evaluation phase of operation: signal CLK is low; input signal IN is a digital high; and input signal INBAR is a digital low. Consequently, transistor m1 conducts and transistor m3 is off. Therefore, in this phase, first node INP1 is charged to first supply voltage 201, in one embodiment VDD, and transistor m2 is turned on by first inverter 296. At the same time, transistor m4 is turned on and transistor m5 is turned off. Consequently, second node INN1 is charged to first supply voltage 201 which, in turn, shuts off transistor m6 and allows half-rail differential driver circuit OUT terminal 291 to be charged to first supply voltage 201. Similarly, transistor m10 conducts and transistor m8 is off. Therefore, in this phase, third node INP2 is charged to second supply voltage 203, in one embodiment ground, and transistor m9 is turned off by third inverter 298. At the same time, transistor m11 is turned off and transistor m12 is turned on. Consequently, fourth node INN2 is charged to second supply voltage 203 which, in turn, turns on transistor m13 and allows half-rail differential driver circuit OUTBAR terminal 293 to be charged to second supply voltage 203.

A particular embodiment of a half-rail differential driver circuit 200 according to the invention is shown in FIG. 2. Those of skill in the art will recognize that half-rail differential driver circuit 200 can be easily modified. For example, different transistors, i.e., PFETS, m1, m2, m4, m8, m9, m11 and NFETS, m3, m5, m6, m7, m10, 13, and m13 could be used. In particular, the NFETs and PFETS shown in FIG. 2 can be readily exchanged for PFETs and NFETs by reversing the polarities of the supply voltages 201 and 203, or by other well known circuit modifications. Consequently, the half-rail differential driver circuit 200 that is shown in FIG. 2, and discussed above, is simply one embodiment of the invention used for illustrative purposes only and does not limit the present invention to that one embodiment of the invention.

As also discussed above, any number of half-rail differential driver circuits can be coupled together with the differential line pair half-rail differential driver circuit OUT terminal 291 and half-rail differential driver circuit OUTBAR terminal 293 coupled to the next stage half-rail differential driver circuit (not shown), identical half-rail differential driver circuit 200, to serve as signals IN and INBAR for that stage.

Using the structure and method of the invention discussed above, the switching differentials are only half-rail. Consequently, the coupling capacitance is reduced by half compared to prior art structures and methods. In addition, since according to the invention, the half-rail differential driver circuit employs a differential line pair of half-rail differential driver circuit OUT terminal and half-rail differential driver circuit OUTBAR terminal, the return path is confined within the differential line pair, virtually eliminating the loop area and therefore virtually eliminating inductive coupling. Consequently, using the half-rail differential driver circuits of the invention, capacitive coupling is reduced up to fifty percent and inductive coupling is minimized, and virtually eliminated, so that delay is reduced, signal speed is increased, less power is used, and bus lines and wires can be of smaller width.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:
1. A half-rail differential driver circuit comprising:
a first supply voltage;
a second supply voltage;
a clock signal;
a half-rail differential driver circuit first IN terminal;
a half-rail differential driver circuit second IN terminal;
a half-rail differential driver circuit third IN terminal;
a half-rail differential driver circuit fourth IN terminal;
a half-rail differential driver circuit first INBAR terminal;
a half-rail differential driver circuit second INBAR terminal;
a half-rail differential driver circuit third INBAR terminal;

a half-rail differential driver circuit fourth INBAR terminal;
a half-rail differential driver circuit first node;
a half-rail differential driver circuit second node;
a half-rail differential driver circuit third node;
a half-rail differential driver circuit fourth node;
a first inverter, said first inverter having a first inverter input terminal and a first inverter output terminal, said first inverter input terminal being coupled to said half-rail differential driver circuit first node;
a second inverter, said second inverter having a second inverter input terminal and a second inverter output terminal, said second inverter input terminal being coupled to said half-rail differential driver circuit second node;
a third inverter, said third inverter having a third inverter input terminal and a third inverter output terminal, said third inverter input terminal being coupled to said half-rail differential driver circuit third node;
a fourth inverter, said fourth inverter having a fourth inverter input terminal and a fourth inverter output terminal, said fourth inverter input terminal being coupled to said half-rail differential driver circuit fourth node;
a half-rail differential driver circuit OUT terminal;
a half-rail differential driver circuit OUTBAR terminal;
a first transistor, said first transistor comprising a first transistor first flow electrode, a first transistor second flow electrode and a first transistor control electrode, said first transistor first flow electrode being coupled to said half-rail differential driver circuit first IN terminal, said first transistor second flow electrode being coupled to said half-rail differential driver circuit first node, said first transistor control electrode being coupled to said half-rail differential driver circuit first INBAR terminal;
a second transistor, said second transistor comprising a second transistor first flow electrode, a second transistor second flow electrode and a second transistor control electrode, said second transistor first flow electrode being coupled to said first supply voltage, said second transistor second flow electrode being coupled to said half-rail differential driver circuit OUT terminal, said second transistor control electrode being coupled to said first inverter output terminal;
a third transistor, said third transistor comprising a third transistor first flow electrode, a third transistor second flow electrode and a third transistor control electrode, said third transistor first flow electrode being coupled to said second supply voltage, said third transistor second flow electrode being coupled to said half-rail differential driver circuit first node, said third transistor control electrode being coupled to said half-rail differential driver circuit first INBAR terminal;
a fourth transistor, said fourth transistor comprising a fourth transistor first flow electrode, a fourth transistor second flow electrode and a fourth transistor control electrode, said fourth transistor first flow electrode being coupled to said first supply voltage, said fourth transistor second flow electrode being coupled to said half-rail differential driver circuit second node, said fourth transistor control electrode being coupled to said half-rail differential driver circuit second INBAR terminal;
a fifth transistor, said fifth transistor comprising a fifth transistor first flow electrode, a fifth transistor second flow electrode and a fifth transistor control electrode, said fifth transistor first flow electrode being coupled to said half-rail differential driver circuit second IN terminal, said fifth transistor second flow electrode being coupled to said half-rail differential driver circuit second node, said fifth transistor control electrode being coupled to said half-rail differential driver circuit second INBAR terminal;
a sixth transistor, said sixth transistor comprising a sixth transistor first flow electrode, a sixth transistor second flow electrode and a sixth transistor control electrode, said sixth transistor first flow electrode being coupled to said second supply voltage, said sixth transistor second flow electrode being coupled to said second transistor second flow electrode and said half-rail differential driver circuit OUT terminal, said sixth transistor control electrode being coupled to said second inverter out terminal;
a seventh transistor, said seventh transistor comprising a seventh transistor first flow electrode, a seventh transistor second flow electrode and a seventh transistor control electrode, said seventh transistor first flow electrode being coupled to said half-rail differential driver circuit OUT terminal, said seventh transistor second flow electrode being coupled to said half-rail differential driver circuit OUTBAR terminal, said seventh transistor control electrode being coupled to said clock signal;
an eighth transistor, said eighth transistor comprising a eighth transistor first flow electrode, a eighth transistor second flow electrode and a eighth transistor control electrode, said eighth transistor first flow electrode being coupled to said half-rail differential driver circuit third INBAR terminal, said eighth transistor second flow electrode being coupled to said half-rail differential driver circuit third node, said eighth transistor control electrode being coupled to said half-rail differential driver circuit third IN terminal;
a ninth transistor, said ninth transistor comprising a ninth transistor first flow electrode, a ninth transistor second flow electrode and a ninth transistor control electrode, said ninth transistor first flow electrode being coupled to said first supply voltage, said ninth transistor second flow electrode being coupled to said half-rail differential driver circuit OUTBAR terminal, said ninth transistor control electrode being coupled to said third inverter output terminal;
a tenth transistor, said tenth transistor comprising a tenth transistor first flow electrode, a tenth transistor second flow electrode and a tenth transistor control electrode, said tenth transistor first flow electrode being coupled to said second supply voltage, said tenth transistor second flow electrode being coupled to said half-rail differential driver circuit third node, said tenth transistor control electrode being coupled to said half-rail differential driver circuit third IN terminal;
a eleventh transistor, said eleventh transistor comprising a eleventh transistor first flow electrode, a eleventh transistor second flow electrode and a eleventh transistor control electrode, said eleventh transistor first flow electrode being coupled to said first supply voltage, said eleventh transistor second flow electrode being coupled to said half-rail differential driver circuit fourth node, said eleventh transistor control electrode being coupled to said half-rail differential driver circuit fourth IN terminal;
a twelfth transistor, said twelfth transistor comprising a twelfth transistor first flow electrode, a twelfth transistor second flow electrode and a twelfth transistor control electrode, said twelfth transistor first flow electrode being coupled to said half-rail differential driver circuit fourth INBAR terminal, said twelfth transistor second flow electrode being coupled to said half-rail differential driver circuit fourth node, said twelfth transistor control electrode being coupled to said half-rail differential driver circuit fourth IN terminal;

a thirteenth transistor, said thirteenth transistor comprising a thirteenth transistor first flow electrode, a thirteenth transistor second flow electrode and a thirteenth transistor control electrode, said thirteenth transistor first flow electrode being coupled to said second supply voltage, said thirteenth transistor second flow electrode being coupled to said ninth transistor second flow electrode and said half-rail differential driver circuit OUTBAR terminal, said thirteenth transistor control electrode being coupled to said fourth inverter out terminal.

2. The half-rail differential driver circuit of claim 1 wherein;

said first supply voltage is VDD and said second supply voltage is ground.

3. The half-rail differential driver circuit of claim 2 wherein;

said first transistor, said second transistor, said fourth transistor, said eighth transistor, said ninth transistor and said eleventh transistor are PFETs, further wherein;

said third transistor, said fifth transistor, said sixth transistor, said seventh transistor, said tenth transistor, said twelfth transistor and said thirteenth transistor are NFETs.

* * * * *